(12) United States Patent
Bamford

(10) Patent No.: US 11,491,930 B2
(45) Date of Patent: Nov. 8, 2022

(54) SYSTEMS AND METHODS FOR COMMANDED OR UNCOMMANDED CHANNEL SWITCHOVER IN A MULTIPLE PROCESSOR CONTROLLER

(71) Applicant: Woodward, Inc., Fort Collins, CO (US)

(72) Inventor: James Bamford, Fort Collins, CO (US)

(73) Assignee: Woodward, Inc., Fort Collins, CO (US)

(*) Notice: Subject to any disclaimer, the term of this patent is extended or adjusted under 35 U.S.C. 154(b) by 360 days.

(21) Appl. No.: 16/702,165

(22) Filed: Dec. 3, 2019

(65) Prior Publication Data
US 2021/0162937 A1 Jun. 3, 2021

(51) Int. Cl.
*B60R 16/023* (2006.01)
*G01R 31/28* (2006.01)
*G05B 9/03* (2006.01)

(52) U.S. Cl.
CPC .......... *B60R 16/023* (2013.01); *G01R 31/282* (2013.01); *G05B 9/03* (2013.01)

(58) Field of Classification Search
CPC .................................................. B60R 16/023
See application file for complete search history.

(56) References Cited

U.S. PATENT DOCUMENTS

| | | | | |
|---|---|---|---|---|
| 3,665,809 A * | 5/1972 | Walker | ...................... | G05B 9/03 91/363 A |
| 5,148,364 A * | 9/1992 | Scherer | ...................... | G05B 7/02 700/82 |
| 6,832,326 B2 * | 12/2004 | Kubo | ........................ | G06F 1/14 713/400 |
| 6,922,625 B2 * | 7/2005 | Weir | ........................ | G05B 9/03 701/14 |
| 8,504,178 B2 * | 8/2013 | Kakino | ..................... | G05B 9/03 700/20 |
| 9,182,754 B2 * | 11/2015 | Meagher | ............ | G05B 19/0425 |
| 9,653,965 B2 * | 5/2017 | Klemen | ............... | H02K 7/1823 |
| 10,338,560 B2 * | 7/2019 | Liu | ...................... | G06F 11/2007 |
| 10,924,663 B2 * | 2/2021 | Ito | ...................... | H04N 5/23227 |
| 2010/0222900 A1 | 9/2010 | Kakino et al. | | |

(Continued)

FOREIGN PATENT DOCUMENTS

EP 0935198 A 11/1999

OTHER PUBLICATIONS

Int'l Search Report and Written Opinion Appln No. PCT/US2020/059932 dated Feb. 5, 2021.

(Continued)

*Primary Examiner* — Michael A Berns
(74) *Attorney, Agent, or Firm* — McAndrews, Held & Malloy, Ltd.

(57) ABSTRACT

Methods and systems for electronic engine control (EEC) systems are disclosed. An EEC monitors and controls operation of an end effector, such as a torque motor. The EEC is configured to command a switchover from an active channel to a standby channel, or vice versa, in response to a trigger (e.g., a command or a fault). The switchover is executed automatically upon identification of the trigger due to the detection of a fault without the need of a command, over a predetermined time or number of cycles within a command signal.

20 Claims, 3 Drawing Sheets

(56) References Cited

U.S. PATENT DOCUMENTS

| | | | |
|---|---|---|---|
| 2013/0035772 A1* | 2/2013 | Pearson | G05B 19/0428 |
| | | | 700/20 |
| 2015/0180309 A1 | 6/2015 | Klemen et al. | |
| 2017/0081019 A1 | 3/2017 | Lin et al. | |
| 2017/0277152 A1 | 9/2017 | Liu et al. | |
| 2020/0094755 A1* | 3/2020 | Kaneko | G06F 1/26 |
| 2020/0107204 A1* | 4/2020 | Barabell | H04W 24/02 |
| 2021/0162937 A1* | 6/2021 | Bamford | G01R 31/282 |

OTHER PUBLICATIONS

Int'l Preliminary Report on Patentability Appln No. PCT/US2020/059932 dated Jun. 16, 2022.

\* cited by examiner

SYSTEMS AND METHODS FOR COMMANDED OR UNCOMMANDED CHANNEL SWITCHOVER IN A MULTIPLE PROCESSOR CONTROLLER

PRIORITY CLAIM/INCORPORATION BY REFERENCE

N/A

FIELD

Certain embodiments of the disclosure relate to control systems. More specifically, certain embodiments of the disclosure relate to an electronic engine control (EEC) to monitor and control operation of an end effector, such as a torque motor. For example, the EEC is configured to command a switchover from an active channel to a standby channel, or vice versa, in response to a trigger (e.g., a fault). Advantageously, the switchover is executed automatically upon identification of the trigger due to the detection of a fault without the need of a command, over a predetermined time or number of cycles within a command signal.

BACKGROUND

Existing EEC systems are employed to regulate a variety of devices, such as fuel flow and thrust management, for optimized performance while protecting the system (e.g., an engine for a vehicle, such as an aircraft) against hazards. The system can be monitored by one or more channels capable of information regarding system safety and operation, for example. For instance, engine signals are analyzed at the EEC, and output signals actuate one or more components to control the system (e.g., valves, pumps, actuators, etc.).

Further limitations and disadvantages of conventional and traditional approaches will become apparent to one of skill in the art, through comparison of such systems with the present disclosure as set forth in the remainder of the present application with reference to the drawings.

BRIEF SUMMARY

Systems and/or methods are provided for an electronic engine control (EEC) to monitor and control operation of an end effector. For example, the EEC may employ an example multiprocessor command system to implement a channel switchover, switching an active channel to a standby channel and the standby channel to the active channel, in response to an input.

More specifically, in disclosed examples, certain embodiments relate to a multiprocessor command system configured to detect a signal to initiate a switchover, initiating a switchover from an existing active channel to a standby channel, and initiating a switchover from an existing standby channel to the active channel.

In a disclosed example, a multiprocessor command system detects a fault via a fault monitoring system in an existing active channel, initiating a switchover from an existing active channel to a standby channel, and initiating a switchover from an existing standby channel to the active channel.

In disclosed examples, a system for dual channel electronic control system includes one or more end effectors on one or more redundant channels. A controller monitors and controls operation of the one or more end effectors. In some examples, the controller is configured to designate a channel as an active channel, the active channel comprising transmitting command current from a controller to an end effector of the one or more end effectors, designate a second channel as a standby channel, the standby channel to maintain an open channel between the controller and the end effector during normal operation, control the active channel to generate a signal that the active channel has ended control of the one or more end effectors, receive a switchover trigger to initiate a fast channel switchover, wherein the second channel automatically transitions to the active channel, transmit a health signal from the first channel to the second channel, command the first channel to transition to the standby channel in response to a switchover command signal, command the second channel to transition to the active channel in response to the switchover command signal, and control the first and second channels so that only one channel is active at a given time.

In some examples, the switchover trigger signal corresponds to a system fault. In examples, the fault corresponds to a current measurement outside a threshold variance. In examples, the fault corresponds to a processor reset in the active channel. In examples, the fault corresponds to a signal from the standby channel indicating a loss of the active channel for a predetermined number of consecutive pulses.

In some examples, the switchover command signal is a predetermined command to switch between channels.

In some examples, the first channel transitions from the active channel to the standby channel. The controller receives a confirmation signal indicating the first channel has transitioned to the standby channel, and commands the second channel to transition from the standby channel to the active channel in response to the confirmation signal.

In some examples, the first channel comprises a state channel and a health channel, the state channel and the health channel having a first duty cycle prior to receipt of the switchover trigger signal. In examples, as the first channel transitions from an active channel to a standby channel, the controller is further configured to change the state channel and the health channel from the first duty cycle to a second duty cycle associated with the standby channel. In examples, the second channel comprises a state channel and a health channel, the state channel having a third duty cycle and the health channel having a fourth duty cycle.

In examples, transitioning the second channel from standby to active comprises changing the state channel from the third duty cycle to the fourth duty cycle. In examples, the active channel is defined by the state channel duty cycle being equal to the health channel duty cycle. In examples, the first duty cycle is 75% and the second duty cycle is 25%.

In some examples, a time period from determination of a fault to the second channel transition to the active channel occurs within 1 ms.

In disclosed examples, a method for dual channel electronic control includes designating a channel as an active channel, the active channel comprising transmitting command current from a controller to an end effector of one or more end effectors. A second channel is designated as a standby channel, the standby channel to maintain an open channel between the controller and the end effector during normal operation. The active channel is controlled to generate a signal that the active channel has ended control of the one or more end effectors. A switchover trigger is received to initiate a fast channel switchover, wherein the second channel automatically transitions to the active channel. A health signal is transmitted from the first channel to the second channel. The first channel is commanded to transition to the standby channel in response to a switchover command signal. The second channel is commanded to transition to the active channel in response to the switchover command signal. And the first and second channels are controlled so that only one channel is active at a given time.

In some examples, the first channel comprises a state channel and a health channel, the state channel and the health channel having a first duty cycle prior to receipt of the switchover trigger signal. In examples, the switchover trigger signal corresponds to a system fault, the method further comprising commanding a health signal of the first channel to transition from a first duty cycle to a second duty cycle in response to the system fault.

In some examples, the method includes the first channel transitioning from the active channel to the standby channel. A confirmation signal is received indicating the first channel has transitioned to the standby channel. And the second channel is commanded to transition from the standby channel to the active channel in response to the confirmation signal. In examples, the dual channel electronic control is implemented on a controller of a vehicle including one of an aircraft, a wheeled vehicle, a maritime vehicle, or a rail vehicle.

In some examples, the end effector is one of a torque motor, a solenoid, or an actuator.

These and various other advantages, aspects and novel features of the present disclosure, as well as details of an illustrated embodiment thereof, will be more fully understood from the following description and drawings.

BRIEF DESCRIPTION OF SEVERAL VIEWS OF THE DRAWINGS

The figures are not necessarily to scale. Where appropriate, similar or identical reference numbers are used to refer to similar or identical components.

DETAILED DESCRIPTION

Figure 1:
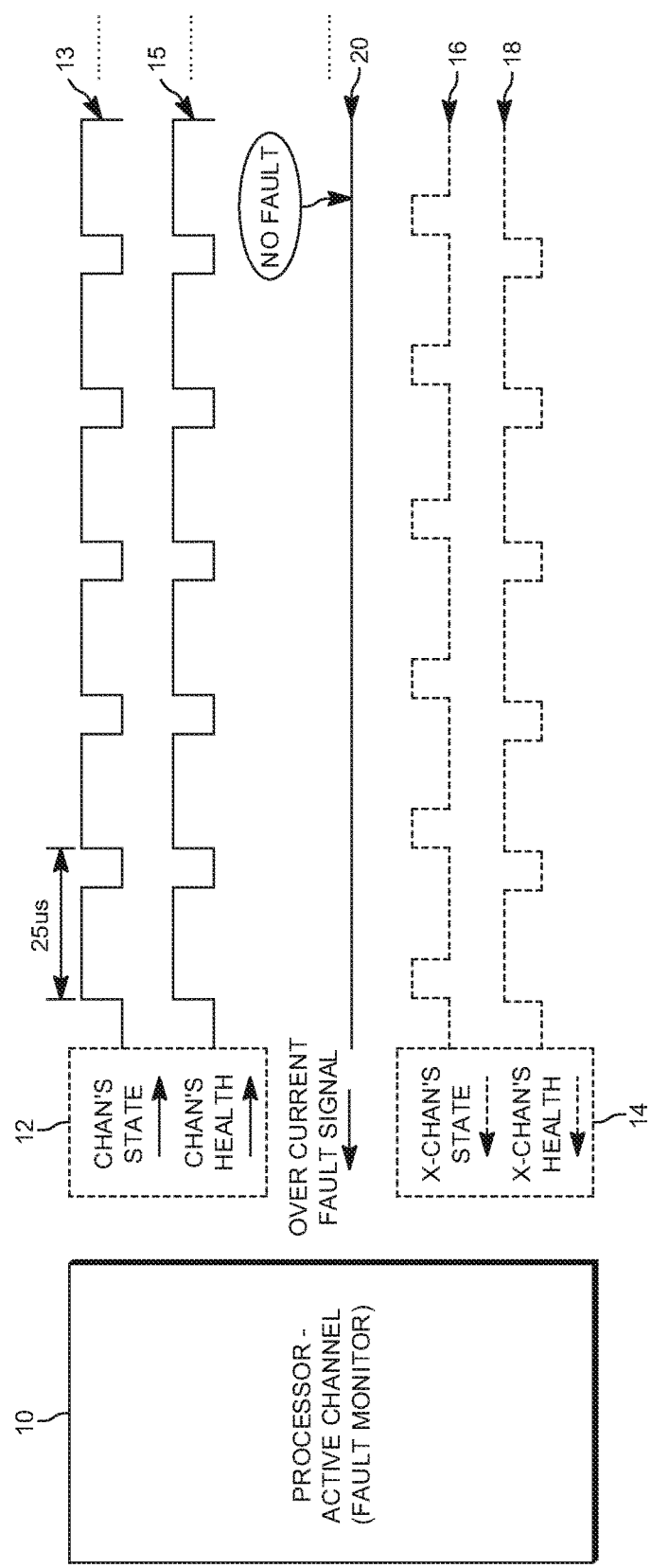
FIG. 1 illustrates an example process diagram for multi-processor fault monitoring under normal operating conditions, in accordance with an example embodiment of the disclosure.

A switchover is defined as a handoff between an active channel and a standby channel (or vice versa). A switchover can be implemented in response to a fault or for other reasons, such as a command from the controller to transition from an active channel to a standby channel, for example. However, only one channel can be active at a given time. Other channels must be on standby to prevent multiple sources providing current (e.g., commands) to a single controlled device (e.g., an end effector, torque motor, solenoid, actuator, etc.). Thus, during a switchover event, the active channel must first disable control of all effectors before the standby channel can become active and enable control of its effectors.

In some examples, the EEC includes multiple channels, each channel having two or more processors. Each channel consists of: (1) state and health signals that operate at a first frequency, (2) open fault detection that operates at a second frequency, and (3) software which operates at yet another frequency. In some examples, both the health and state signals operate at a frequency of 40 KHz.

The state signal indicates which state a particular channel is in (e.g., active, inactive, standby). In some examples, the state signal is initially inactive, until it is driven through power-on built-in test (PBIT) testing by a processor (e.g., a low-level co-processor, a peripheral, an I/O processor, an Enhanced Time Processor Unit (eTPU) microcode, etc.). After PBIT testing, the state signal is rendered idle, awaiting a command to change to either an active or a standby from the control software. When a channel is operating in an active state, the channel provides an output having a first duty cycle (e.g., a 75% duty cycle). When operating in a standby state, the channel provides an output having a second, often complimentary, duty cycle (e.g., a 25% duty cycle). Accordingly, when the system is initialized, both the state and health signals corresponding to the active channel are output with a 75% duty cycle. The state signal corresponding to the standby channel is output with a 25% duty cycle, which further ensures that the standby signal does not provide current to the end effector.

The health signal is employed in one of two ways: (1) to notify the controller of a fault at the end effector, or (2) as a redundant cross-channel state monitor. For example, a determination that the active channel is operating with a 75% duty cycle indicates that no fault has occurred, whereas determination that the active channel is operating with a 25% duty cycle indicates that a fault has been detected. In an additional or alternative example embodiment, phase shift keying (PSK) modulation is employed to enable a single signal to carry both the state and the health data.

As disclosed herein, a commanded switchover is one that occurs in response to a predetermined or expected trigger. The purpose of coordinating switchovers between active and standby channels is to ensure only a single processor is controlling a single end effector at any given time. Advantageously, the commanded switchover process disclosed herein also minimizes switchover time between channels.

During a commanded switchover, the active channel receives a command signal from the controller to switch from active to standby. In response to the command signal, the active channel state signal changes, for example, from a 75% duty cycle to a 25% duty cycle. Additionally or alternatively, the outputted state signal is phase shifted, for example, by 270 degrees.

Further, during a commanded switchover the standby channel receives a command signal to transition from a standby channel to an active channel. Before the transition is complete, the standby channel first receives confirmation that the initially active channel has transitioned to a standby channel. Confirmation is provided by monitoring of the state signal and determination that the duty cycle has transitioned, for example, from an active 75% duty cycle to a standby 25% duty cycle. Once this transition is confirmed, the initial standby channel changes the output signal from a 25% duty cycle to a 75% duty cycle, and/or the phase of its state signal is shifted by 270 degrees, for example.

Additionally or alternatively, the health signal output changes from a 75% duty cycle to a 25% duty cycle, and/or the health signal is phase shifted by 270 degrees, following a commanded switchover. Once the channel that was initially designated as the standby channel has transitioned to the active channel, the active channel provides command signals based on the current software settings controlling the corresponding end effector (e.g., torque motor (TM)), continuing operation without interruption. As noted, the disclosed systems and methods implement this process in an approximate 1 millisecond timeframe.

Alternatively, the disclosed systems and methods can be implanted to effect an uncommanded switchover. For example, an uncommanded switchover may occur in response to detection of a fault condition at the corresponding end effector (e.g., torque motor). The fault can be identified by monitoring changes within the active channel signal. In some examples, the changes are evaluated with respect to switchover trigger logic associated with the health monitor.

For instance, when the health monitor on the active channel determines a fault condition exists at the corresponding end effector (e.g., torque motor), the health monitor sets the channels' state flag to standby in order to force an uncommanded switchover. In response to the fault condition, the health signal changes from a 75% duty cycle to a 25% duty cycle, and/or the signal is phase shifted by 270 degrees. In some examples, the processing algorithm monitoring the device's control loop identifies the change in the state flag, and controls the active device to disable. Similar to the transition during a commanded switchover, the state signal changes from a 75% duty cycle to a 25% duty cycle, and/or the signal phase is shifted by 270 degrees. In some examples, a flag can be employed to signal a change in channel status (e.g., active to standby or vice versa). In examples, the flag can represent a fault, such that a given fault may provide a unique flag (e.g., corresponding to an open circuit, a short circuit, a processor reset, etc.).

Accordingly, the state signal has completed a transition to a standby channel, as indicated by a 25% duty cycle. In response, the channel initially designated as the standby channel transitions to the active channel. This is implemented by the state signal changing from a 25% duty cycle to a 75% duty cycle, and/or the signal is phase shifted by 270 degrees.

During operation, in some examples a fault monitor associated with the standby channel monitors the health and state signals associated with the active channel. In response to the standby channel health monitor detecting a fault in the active channel's health signal, the standby channel changes the standby state flag to an active state flag, and transitions to a duty cycle associated with the active channel (e.g., a 75% duty cycle) on its state signal.

The disclosed systems and methods offer many advantages over conventional systems. For example, the disclosed EEC provides a handshaking mechanism ensuring only a single channel is controlling each end effector at a time (e.g., during a switchover operation). Additionally, implementing the disclosed EEC reduces engine transients during channel switchover (e.g., reduces the amount of time that the end effector is not being controlled by either the first or the second channel during a switchover). The disclosed EEC also results in a switchover occurring in a reduced amount of time upon receipt of a trigger (e.g., within approximately 1 millisecond of a fault occurring on the active channel), which reduces engine transients.

Additionally, the disclosed EEC provides redundancy of the state signal to ensure efficient monitoring and transition in response to a fault. The disclosed EEC also provides a mechanism for low latency status information updates regarding the corresponding end effector/torque motor (e.g., responsible for system functions, such as fuel control). Further, the disclosed EEC allows timed and/or spaced operating system(s) to be implemented in a multi-frequency device driver design.

As utilized herein, "and/or" means any one or more of the items in the list joined by "and/or". For example, "x and/or y" means any element of the three-element set {(x), (y), (x, y)}. Similarly, "x, y, and/or z" means any element of the seven-element set {(x), (y), (z), (x, y), (x, z), (y, z), (x, y, z)}. As utilized herein, the term "module" refers to functions that can be implemented in hardware, software, firmware, or any combination of one or more thereof. As utilized herein, the term "exemplary" means serving as a non-limiting example, instance, or illustration.

As utilized herein, the terms "first" and "second" may be used to enumerate different components or elements of the same type, and do not necessarily imply any particular order. For example, while in some examples a first time occurs prior to a second time within a time period, the terms "first time" and "second time" do not imply any specific order in which the first or second times occur relative to the other within the time period.

As utilized herein, a "circuit," or "circuitry," includes any analog and/or digital components, power and/or control elements, such as a microprocessor, digital signal processor (DSP), software, and the like, discrete and/or integrated components, or portions and/or combinations thereof.

As utilized herein, the terms "control circuit," "control circuitry," and/or "controller," may include digital and/or analog circuitry, discrete and/or integrated circuitry, processors, microprocessors, digital signal processors (DSPs), and/or other logic circuitry, and/or associated software, hardware, and/or firmware. Control circuits or control circuitry may be located on one or more circuit boards that form part or all of a controller.

As utilized herein, the term "memory" includes volatile and non-volatile memory devices and/or other storage device.

FIG. 1 illustrates an example process diagram where a processor 10 containing a fault monitor transmits one or both of a signal via a state channel 13 and a health channel 15, identified by reference numeral 12. As shown in the example of FIG. 1, both state and health channel signals are transmitted with a similar duty cycle, approximately 75%, with a period for the pulsed signal of approximately 25 microseconds.

Additionally, the processor 10 receives one or more signals from a second processor. For example, feedback signals corresponding to the state channel and health channel of the second processor are received and analyzed by the processor 10, and indicated by reference numeral 14. For instance, a state signal 16 of the second processor is characterized by an approximate 25% duty cycle, whereas a health signal 18 of the second processor is characterized by an approximate 75% duty cycle. Furthermore, an over current fault signal 20 is provided to the processor 10. In this example, a constant fault signal at the active channel indicates the absence of an over current situation. Thus, FIG. 1 illustrates a multiprocessor fault monitoring process under normal operating conditions.

Figure 2:
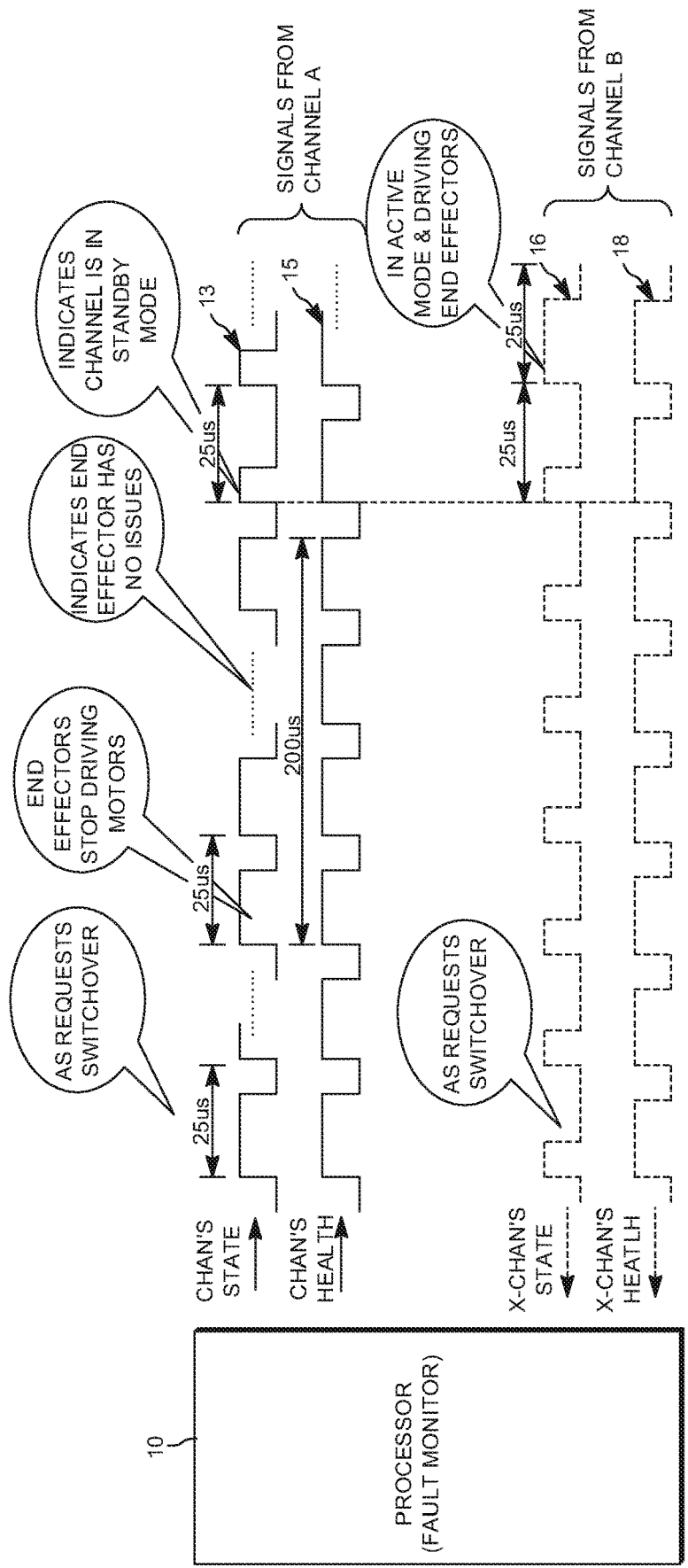
FIG. 2 illustrates an example process diagram for multi-processor fault monitoring during a commanded switchover, in accordance with an example embodiment of the disclosure.

FIG. 2 illustrates an example process diagram for a commanded switchover operation. For example, the processor 10 transmits one or both of a signal via a state channel and a health channel, both with an approximately 75% duty cycle and a period for the pulsed signal of approximately 25 microseconds. In the example of FIG. 2, the state channel 13 is operating as the active channel.

The processor 10 receives one or more signals corresponding to the state channel and health channel of the second processor, which are analyzed by the processor 10. As shown, the state signal 16 of the second processor is characterized by an approximate 25% duty cycle, the health signal 18 of the second processor is characterized by an approximate 75% duty cycle. As shown, the state channel 16 is operating as the standby channel.

In the example of FIG. 2, a commanded switchover operation is initiated by the processor 10, such as a timer and/or scheduled transition. In this example, the processor 10 initiates a channel switchover in response to a command from the application software (AS) of the active channel 13 (or initiated by a hardware fault), such as a processor reset or channel usage balancing, in the active channel.

In response to a command for a channel switchover, the active channel 13 relinquishes control of the device and disables control of corresponding effectors prior to transitioning the state channel 16 of the second processor from the standby channel to the active channel (and enabling control of corresponding effectors of the state channel 16). For example, the status of each channel (e.g., active or standby) shall be provided to the AS, which can be performed in a period of time less than or equal to approximately 5 microseconds.

In some examples, a processor reset can be triggered by a central controller (e.g., a central processing platform connected to each respective processor) to force a processor reset, such as in response to a non-responsive and/or damaged sensor or end effector. In such an example, the standby channel would not receive any signals, and a switchover would be commanded as disclosed herein.

In some examples, the commanded switchover can be in response to a determination that a particular channel's health score, in comparison to another channel's health score, requires a transition from active to standby or vice versa.

Further, when a switchover is implemented in a vehicle such as an aircraft, the channel transition is effected so as to limit or eliminate any operational impact on the EEC cockpit outputs (e.g., lamps, relays, radio transmissions, etc.).

Figure 3:
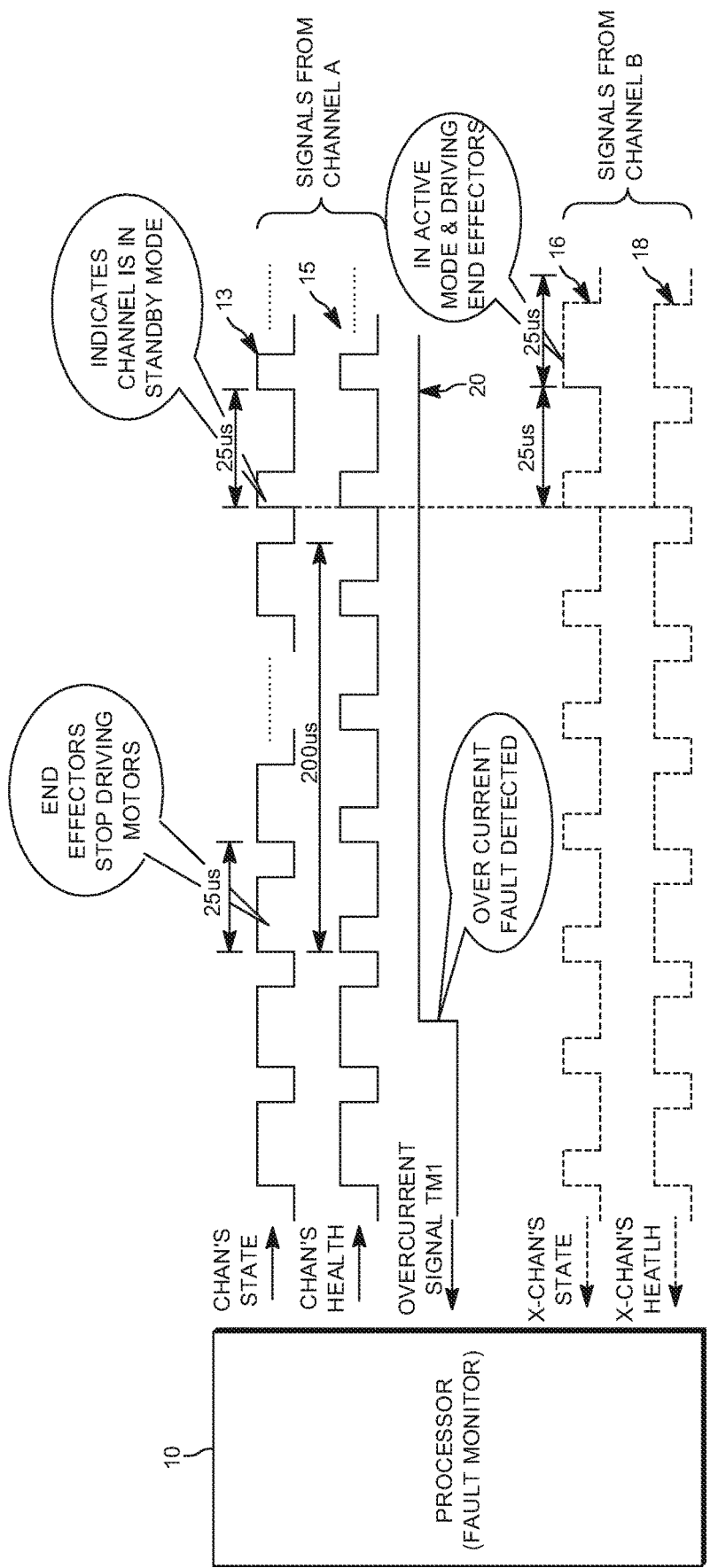
FIG. 3 illustrates an example process diagram for multi-processor fault monitoring during an uncommanded switchover, in accordance with an example embodiment of the disclosure.

FIG. 3 illustrates an example process diagram for an uncommanded switchover operation. As disclosed herein, an uncommanded switchover is initiated by identification of a trigger, such as a fault (e.g., an open circuit condition, a short circuit, etc.). In some examples, the fault is caused by an identification at the standby channel (e.g., state channel 16) of signal loss on the active channel for a predetermined number of consecutive pulses (e.g., such as three, which may change depending on the desired response time). In some examples, the fault corresponds to an overcurrent condition on the active channel, indicating a fault at the controlled device, such as a hardware failure.

In the example of FIG. 3, the processor 10 transmits a signal via one or both of the state channel 13 and the health channel 15 with an approximately 75% duty cycle and a period for the pulsed signal of approximately 25 microseconds, and receives signals corresponding to the state channel 16 and health channel 18 of the second processor, which are analyzed by the processor 10. As shown, the state signal 16 is characterized by an approximate 25% duty cycle, and the health signal 18 characterized by an approximate 75% duty cycle.

In the example of FIG. 3, a fault signal 20, shown indicating an "overcurrent signal TM1," is provided to the processor 10, where a transition from a first (low) level to a second (high) level indicates a fault, generating a trigger. Although described as an indicator of an overcurrent condition, the fault signal 20 can correspond to a variety of faults (e.g., signal loss on the active channel). Upon receipt of the fault signal 20 trigger, the next pulse on the health channel 15 illustrates a transition from a 75% duty cycle to a 25% duty cycle. Following the health channel 15 transition, the state channel 13 disables control of the end effector. For example, this can occur over a given timeframe (e.g., approximately 200 microseconds) and/or a predetermined number of cycles (e.g., approximately four cycles).

As illustrated in FIG. 3, following expiration of the given timeframe and/or number of cycles, the next duty cycle of the state channel 13 transitions to 25%. This indicates the state channel 13 has transitioned from the active channel to the standby channel. Further, the state channel 16 from the second processor transitions from a 25% duty cycle to a 75% duty cycle, indicating the second processor is controlling the active channel. As shown, the transition of the state channel 16 from the second processor to the active channel can occur over a complete duty cycle in response to detecting the state channel of the processor 10 has transitioned to the standby channel.

In some examples, the PWM generator code is responsible for generating the associated channel's health signals. In some examples, the processor's fault monitor regulates the channels such that, at any given time, a single channel controls the end effector. In such an example, an end effector receives commands from a single channel only, so as not to receive multiple competing and/or contrary commands from multiple channels.

The fault monitor is further configured to monitor the cross channel's health signal when operating in standby mode. Thus, a transition from the standby channel to the active channel is triggered by a determination at the state signal of the first processor that the duty cycle has changed, and the state signal of the first processor no longer operates as the active channel.

Further, the AS generates signals to command a particular channel to operate in an active or a standby mode. The AS also provides current settings to both the active and standby channels, which can be used to command the active channel and the standby channel to swap status (in response to an uncommanded switchover).

With reference to the several figures, multiple advantages are achieved through the innovative systems and methods disclosed herein.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A system for dual channel electronic control system, comprising:
    one or more end effectors on one or more redundant channels;
    a controller to monitor and control operation of the one or more end effectors, the controller being configured to:
        designate a first channel as an active channel, the active channel comprising transmitting command current from the controller to an end effector of the one or more end effectors, wherein the first channel comprises a first state channel and a first health channel;

designate a second channel as a standby channel, the standby channel to maintain an open channel between the controller and the end effector during normal operation;

control the active channel to generate a signal that the active channel has ended control of the one or more end effectors;

receive a switchover trigger signal to initiate a fast channel switchover, wherein the second channel automatically transitions to the active channel;

transmit a health signal from the first channel to the second channel;

command the first channel to transition to the standby channel in response to a switchover command signal;

command the second channel to transition to the active channel in response to the switchover command signal; and control the first and second channels so that only one channel is active at a given time.

2. The system of claim 1, wherein the switchover trigger signal corresponds to a system fault.

3. The system of claim 2, wherein the fault corresponds to a current measurement outside a threshold variance.

4. The system of claim 2, wherein the fault corresponds to a processor reset in the active channel.

5. The system of claim 2, wherein the controller is further configured to transmit a pulsed signal via the active channel or the standby channel, and wherein the fault corresponds to a fault signal from the standby channel indicating a loss of the active channel for a predetermined number of consecutive pulses of the pulsed signal.

6. The system of claim 1, wherein the switchover command signal is a predetermined command to switch between the first and second channels.

7. The system of claim 1, wherein as the first channel transitions from the active channel to the standby channel, the controller is further configured to:

receive a confirmation signal indicating the first channel has transitioned to the standby channel; and command the second channel to transition from the standby channel to the active channel in response to the confirmation signal.

8. The system of claim 1, wherein the first state channel and the first health channel have a first duty cycle prior to receipt of the switchover trigger signal.

9. The system of claim 8, wherein as the first channel transitions from the active channel to the standby channel, the controller is further configured to change the first state channel and the first health channel from the first duty cycle to a second duty cycle associated with the standby channel.

10. The system of claim 9, wherein the first duty cycle is 75% and the second duty cycle is 25%.

11. The system of claim 8, wherein the second channel comprises a second state channel and a second health channel, the second state channel having a third duty cycle and the second health channel having a fourth duty cycle.

12. The system of claim 11, wherein the transitioning the second channel from the standby channel to the active channel comprises changing the second state channel from the third duty cycle to the fourth duty cycle.

13. The system of claim 1, wherein whether the first channel is the active channel is defined by a duty cycle of the first state channel being equal to a duty cycle of the first health channel.

14. The system of claim 1, wherein a time period from determination of a fault to the second channel transition to the active channel occurs within 1 ms.

15. The system of claim 1, wherein the first state channel or the first health channel has a first duty cycle prior to receipt of the switchover trigger signal, and the second channel comprises a second state channel and a second health channel, the second state channel or the second health channel having a second duty cycle different from the first duty cycle prior to receipt of the switchover trigger signal.

16. A method for dual channel electronic control comprising:

designating a first channel as an active channel, the active channel comprising transmitting command current from a controller to an end effector of one or more end effectors;

designating a second channel as a standby channel, the standby channel to maintain an open channel between the controller and the end effector during normal operation;

controlling the active channel to generate a signal that the active channel has ended control of the one or more end effectors;

receiving a switchover trigger signal to initiate a fast channel switchover, wherein the second channel automatically transitions to the active channel, wherein the first channel comprises a state channel and a health channel, the state channel and the health channel having a first duty cycle prior to receipt of the switchover trigger signal;

transmitting a health signal from the first channel to the second channel;

commanding the first channel to transition to the standby channel in response to a switchover command signal;

commanding the second channel to transition to the active channel in response to the switchover command signal; and controlling the first and second channels so that only one channel is active at a given time.

17. The method of claim 16, wherein the switchover trigger signal corresponds to a system fault, the method further comprising commanding the health signal of the first channel to transition from the first duty cycle to a second duty cycle in response to the system fault.

18. The method of claim 16, further comprising:

transitioning the first channel from the active channel to the standby channel;

receiving a confirmation signal indicating the first channel has transitioned to the standby channel; and commanding the second channel to transition from the standby channel to the active channel in response to the confirmation signal.

19. The method of claim 16, wherein the dual channel electronic control is implemented on the controller of a vehicle including one of an aircraft, a wheeled vehicle, a maritime vehicle, or a rail vehicle.

20. The method of claim 16, wherein the end effector is one of a torque motor, a solenoid, or an actuator.

* * * * *